United States Patent
Chen

(10) Patent No.: US 11,335,828 B2
(45) Date of Patent: May 17, 2022

(54) METHOD OF HANDLING MICRO DEVICE

(71) Applicant: MIKRO MESA TECHNOLOGY CO., LTD., Apia (WS)

(72) Inventor: Li-Yi Chen, Tainan (TW)

(73) Assignee: MIKRO MESA TECHNOLOGY CO., LTD., Apia (WS)

( * ) Notice: Subject to any disclaimer, the term of this patent is extended or adjusted under 35 U.S.C. 154(b) by 21 days.

(21) Appl. No.: 16/706,776

(22) Filed: Dec. 8, 2019

(65) Prior Publication Data

US 2021/0175389 A1    Jun. 10, 2021

(51) Int. Cl.
*H01L 33/00* (2010.01)
*B32B 38/18* (2006.01)
*H01L 33/48* (2010.01)

(52) U.S. Cl.
CPC .......... *H01L 33/0095* (2013.01); *B32B 38/18* (2013.01); *H01L 33/48* (2013.01); *H01L 2933/0033* (2013.01)

(58) Field of Classification Search
CPC ................. H01L 33/0095; H01L 33/48; H01L 2933/0033; B32B 38/18
See application file for complete search history.

(56) References Cited

U.S. PATENT DOCUMENTS

| | | | |
|---|---|---|---|
| 10,141,475 B1 * | 11/2018 | Chen | H01S 5/0216 |
| 10,312,218 B1 | 6/2019 | Chen | |
| 2004/0154733 A1 * | 8/2004 | Morf | H01L 21/6835 156/241 |
| 2019/0252221 A1 | 8/2019 | Chen et al. | |
| 2019/0252350 A1 * | 8/2019 | Schwarz | H01L 24/97 |

* cited by examiner

*Primary Examiner* — Jay C Chang
*Assistant Examiner* — Mikka Liu
(74) *Attorney, Agent, or Firm* — CKC & Partners Co., LLC

(57) ABSTRACT

A method of handling a micro device is provided. The method includes: holding the micro device by a transfer head; forming a liquid layer between the micro device and a substrate; maintaining a first temperature of the transfer head to be lower than an environmental temperature; maintaining a second temperature of the substrate to be lower than the environmental temperature; and binding the micro device to the substrate by the liquid layer.

9 Claims, 5 Drawing Sheets

METHOD OF HANDLING MICRO DEVICE

BACKGROUND

Field of Invention

The present disclosure relates to a method of handling a micro device.

Description of Related Art

The statements in this section merely provide background information related to the present disclosure and do not necessarily constitute prior art.

Traditional technologies for the transfer of devices include transferring from a transfer wafer to a receiving substrate by wafer bonding. One such implementation is "direct bonding" which involves one bonding stage of an array of devices from a transfer wafer to a receiving substrate, followed by removal of the transfer wafer. Another such implementation is "indirect bonding" which involves two bonding/de-bonding stages. In indirect bonding, a transfer head may pick up an array of devices from a donor substrate, and then bond the array of devices to a receiving substrate, followed by removal of the transfer head.

In recent years, many researchers and experts have been working hard to overcome those difficulties in making a massive transfer of devices (i.e., transferring millions or tens of millions of devices) feasible for commercial applications. Among those difficulties, how to achieve cost reduction, time efficiency, and yield are three of the key issues in the industry.

SUMMARY

According to some embodiments of the present disclosure, a method of handling a micro device is provided. The method includes: holding the micro device by a transfer head; forming a liquid layer between the micro device and a substrate; maintaining a first temperature of the transfer head to be lower than an environmental temperature; maintaining a second temperature of the substrate to be lower than the environmental temperature; and binding the micro device to the substrate by the liquid layer.

It is to be understood that both the foregoing general description and the following detailed description are by examples, and are intended to provide further explanation of the present disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
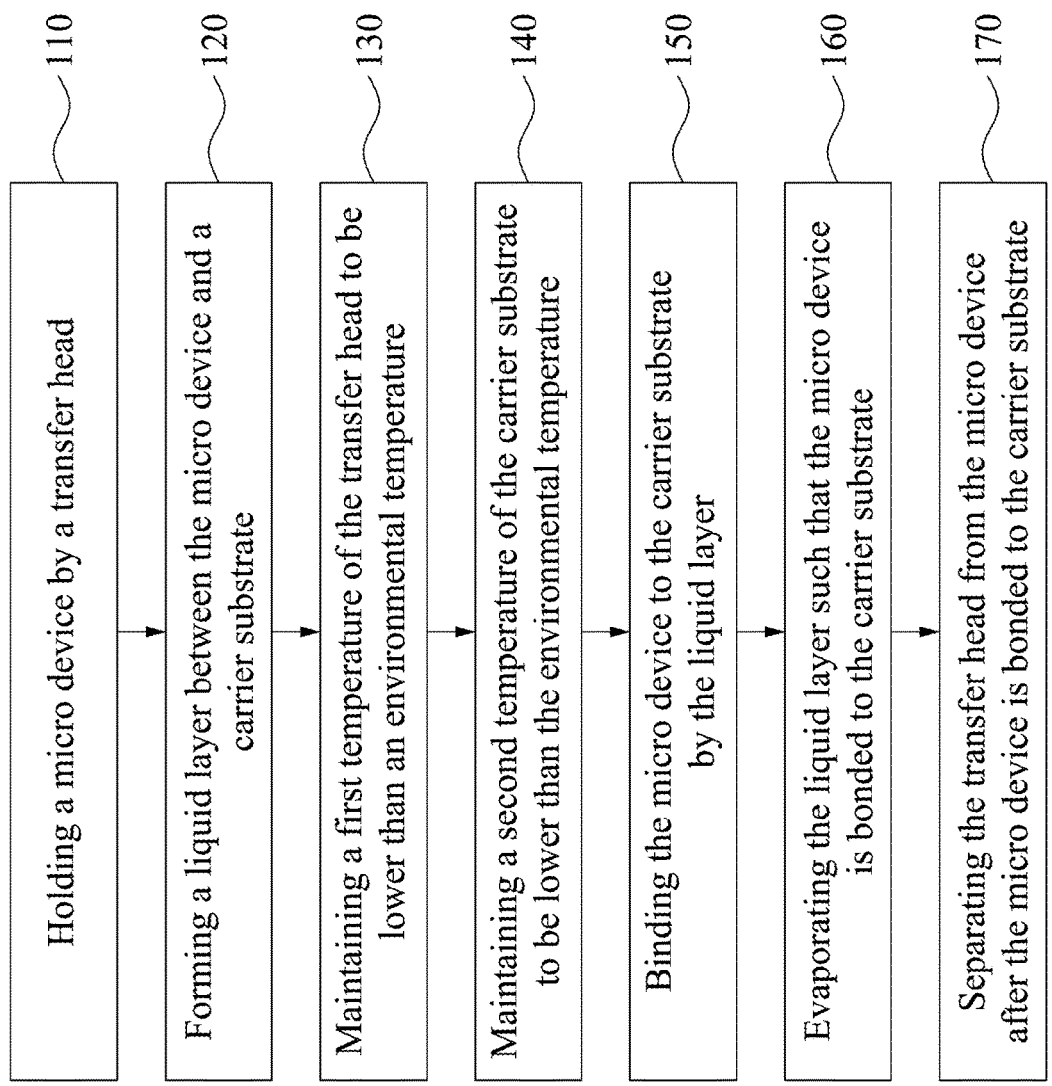
FIG. 1 is a flow chart of a method of handling a micro device according to some embodiments of the present disclosure.

Reference will now be made in detail to the present embodiments of the disclosure, examples of which are illustrated in the accompanying drawings. Wherever possible, the same reference numbers are used in the drawings and the description to refer to the same or like parts.

In various embodiments, the description is made with reference to figures. However, certain embodiments may be practiced without one or more of these specific details, or in combination with other known methods and configurations. In the following description, numerous specific details are set forth, such as specific configurations, dimensions, and processes, etc., in order to provide a thorough understanding of the present disclosure. In other instances, well-known semiconductor processes and manufacturing techniques have not been described in particular detail in order to not unnecessarily obscure the present disclosure. Reference throughout this specification to "one embodiment," "an embodiment" or the like means that a particular feature, structure, configuration, or characteristic described in connection with the embodiment is included in at least one embodiment of the disclosure. Thus, the appearances of the phrase "in one embodiment," "in an embodiment" or the like in various places throughout this specification are not necessarily referring to the same embodiment of the disclosure. Furthermore, the particular features, structures, configurations, or characteristics may be combined in any suitable manner in one or more embodiments.

The terms "over," "to," "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

Figure 2:
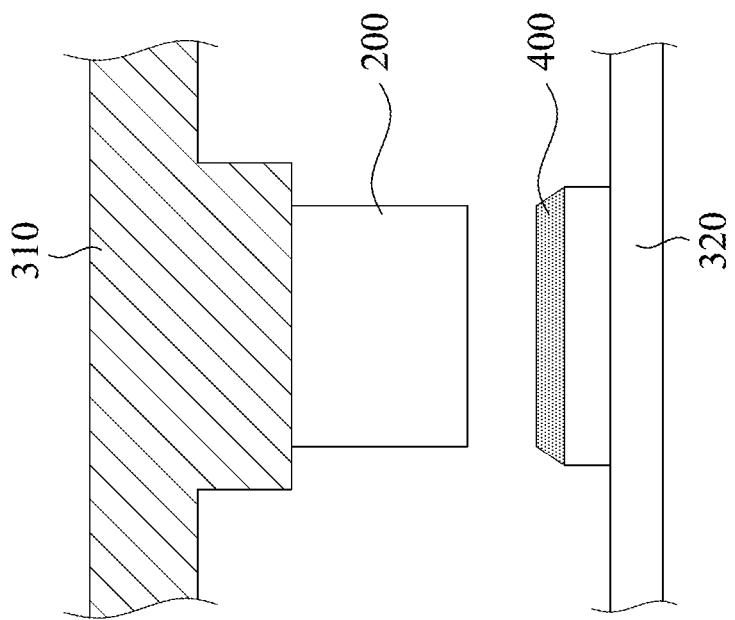
FIG. 2 is a schematic cross-sectional view of an intermediate stage of the method illustrated by FIG. 1 according to some embodiments of the present disclosure.

Reference is made to FIG. 1. FIG. 1 is a flow chart of a method 100 of handling a micro device (e.g., the micro device 200 shown in FIG. 2) according to some embodiments of the present disclosure. In some embodiments, the method 100 of handling the micro device 200 is provided. As shown in FIG. 1, with reference to FIGS. 2-4, the handling method 100 of the embodiment includes the following operations (it is appreciated that the sequence of the operations and the sub-operations as mentioned below, unless otherwise specified, can all be adjusted upon the actual needs, or even executed at the same time or partially at the same time):

(1) Holding the micro device 200 by a transfer head 310. (Operation 110, as illustrated by FIG. 2)

(2) Forming a liquid layer 400 between the micro device 200 and a substrate 320. (Operation 120, as illustrated by FIG. 2)

(3) Maintaining a first temperature of the transfer head 310 to be lower than an environmental temperature. (Operation 130)

(4) Maintaining a second temperature of the substrate 320 to be lower than the environmental temperature. (Operation 140)

Figure 3:
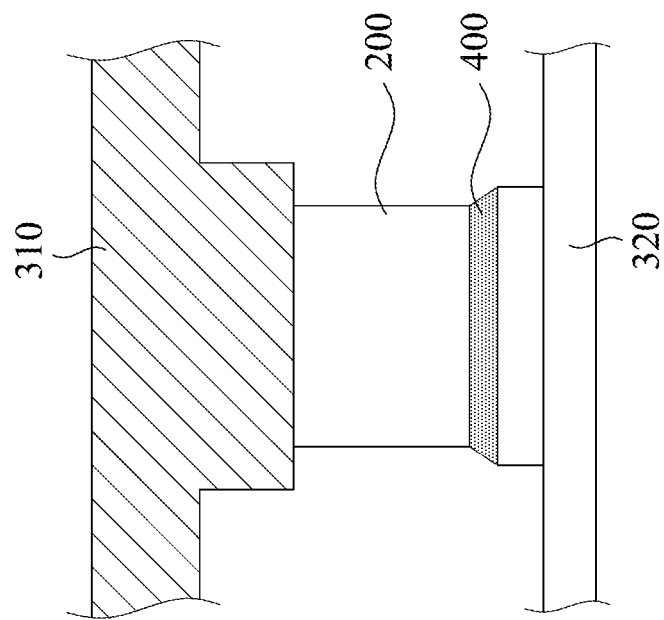
FIG. 3 is a schematic cross-sectional view of an intermediate stage of the method illustrated by FIG. 1 according to some embodiments of the present disclosure.

(5) Binding the micro device 200 to the substrate 320 by the liquid layer 400. (Operation 150, as illustrated by FIG. 3)

Figure 4:
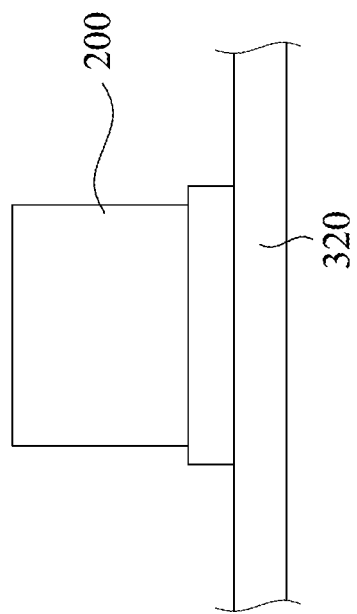
FIG. 4 is a schematic cross-sectional view of an intermediate stage of the method illustrated by FIG. 1 according to some embodiments of the present disclosure.

(6) Evaporating the liquid layer 400 such that the micro device 200 is bound to the substrate 320. (Operation 160, as illustrated by FIG. 4)

(7) Separating the transfer head 310 from the micro device 200 after the micro device 200 is bound to the substrate 320. (Operation 170, as illustrated by FIG. 4)

Reference is made to FIG. 2. FIG. 2 is a schematic cross-sectional view of an intermediate stage of the method 100 illustrated by FIG. 1 according to some embodiments of the present disclosure, in which the liquid layer 400 is formed on the substrate 320. In some embodiments, as shown in FIG. 2, the transfer head 310 is positioned above the substrate 320. The micro device 200 is held by the transfer head 310, which is the operation 110 of the method 100, such that the micro device 200 is positioned between the transfer head 310 and the substrate 320. In some embodiments, the micro device 200 is held by the transfer head 310 via a mechanical force (e.g., an adhesive force) or an electromagnetic force (e.g., an electrostatic force or an enhanced electrostatic force generated by an alternating voltage through bipolar electrodes), and should not be limited thereto. In practical applications, the micro device 200 is microscopic light emitting diode (micro-LED). However, this does not intend to limit the present disclosure.

Furthermore, the liquid layer 400 is formed between the micro device 200 and the substrate 320, which is the operation 120 of the method 100. To be exact, in some embodiments, the liquid layer 400 is formed on a surface of the substrate 320 facing to the transfer head 310 and the micro device 200.

Technically speaking, in some embodiments, the liquid layer 400 includes water. In some embodiments, the liquid layer 400 is formed by lowering the second temperature of the substrate 320 in an environment including a water vapor such that at least a portion of the water vapor is condensed to form the liquid layer 400. In some embodiments, the second temperature of the substrate 320 is lowered to about the dew point of the water vapor to form the liquid layer 400. In some embodiments, the liquid layer 400 is formed by showering a water vapor to the substrate 320 such that at least a portion of the water vapor is condensed to form the liquid layer 400 on the substrate 320.

Before the transfer head 310 moves towards the substrate 320 such that the micro device 200 is to be bound to the liquid layer 400, the first temperature of the transfer head 310 is decreased and maintained to be lower than the environmental temperature, which is the operation 130 of the method 100. Since the first temperature of the transfer head 310 is decreased and maintained to be lower than the environmental temperature, the temperature of the micro device 200 held by the transfer head 310 is decreased and maintained to be lower than the environmental temperature as well. Practically, for instance, the environmental temperature is lower than about 40 degree Celsius. Therefore, the first temperature of the transfer head 310 is decreased and maintained to be lower than about 40 degree Celsius. For example, the first temperature of the transfer head 310 can be maintained to be 10, 15, 20, 25, 30 or 35 degree Celsius, according to the actual situations. It should be noted that, the practical measures to decrease and maintain the first temperature of the transfer head 310 are not limited in the present disclosure.

Moreover, on the other hand, before the transfer head 310 moves towards the substrate 320 such that the micro device 200 is to be bound to the liquid layer 400, the second temperature of the substrate 320 is decreased and maintained to be lower than the environmental temperature, which is the operation 140 of the method 100. Similarly, for instance, since the environmental temperature is lower than about 40 degree Celsius as mentioned above, the second temperature of the substrate 320 is decreased and maintained to be lower than about 40 degree Celsius. For example, the second temperature of the substrate 320 can be maintained to be 10, 15, 20, 25, 30 or 35 degree Celsius, according to the actual situations. Similarly, it should be noted that, the practical measures to decrease and maintain the second temperature of the substrate 320 are not limited in the present disclosure.

Furthermore, according to the actual situations, the first temperature of the transfer head 310 and the second temperature of the substrate 320 can be decreased and maintained at the same temperature that is lower than the environmental temperature. On the other hand, according to the actual situations, the first temperature of the transfer head 310 and the second temperature of the substrate 320 can be decreased and maintained at the different temperatures that are lower than the environmental temperature.

Reference is made to FIG. 3. FIG. 3 is a schematic cross-sectional view of an intermediate stage of the method 100 illustrated by FIG. 1 according to some embodiments of the present disclosure. In some embodiments, as shown in FIG. 3, after both the first temperature of the transfer head 310 and the second temperature of the substrate 320 are respectively decreased and maintained to be lower than the environmental temperature as mentioned above, the transfer head 310 moves towards the substrate 320 such that the micro device 200 is bound by the liquid layer 400 to the substrate 320, which is the operation 150 of the method 100.

It is worth to note that, provided that both the first temperature of the transfer head 310 and the second temperature of the substrate 320 are respectively decreased and maintained to be lower than the environmental temperature, when the transfer head 310 is moved towards the substrate 320 and the micro device 200 is moved very close to the liquid layer 400, an evaporation of the liquid layer 400 is slowed down at the moment the micro device 200 is in contact with the liquid layer 400. In other words, the presence of the liquid layer 400 is effectively maintained such that the two opposite sides of the liquid layer 400 can be in contact with the micro device 200 and the substrate 320 respectively.

To be more specific, in some embodiments, when the micro device 200 is in contact with the liquid layer 400, the micro device 200 is gripped by a capillary force produced by at least some portions of the liquid layer 400 which are located between the micro device 200 and the substrate 320. This capillary force is larger in magnitude than the force that the transfer head 310 is holding the micro device 200.

Reference is made to FIG. 4. FIG. 4 is a schematic cross-sectional view of an intermediate stage of the method 100 illustrated by FIG. 1 according to some embodiments of the present disclosure. In some embodiments, after the micro device 200 is in contact with the substrate 320, the liquid layer 400 is then evaporated such that the micro device 200 is bound to the substrate 320, as shown in FIG. 4, which is the operation 160 of the method 100. At this moment, the transfer head 310 can be separated from the micro device 200, leaving the micro device 200 being bound to the substrate 320, which is the operation 170 of the method 100.

In addition, in order to slow down the evaporation of the liquid layer 400 at the moment the micro device 200 is in contact with the liquid layer 400, the relative humidity of the environment is maintained to be higher than about 40%. However, this value of relative humidity does not intend to limit the present disclosure.

Figure 5:
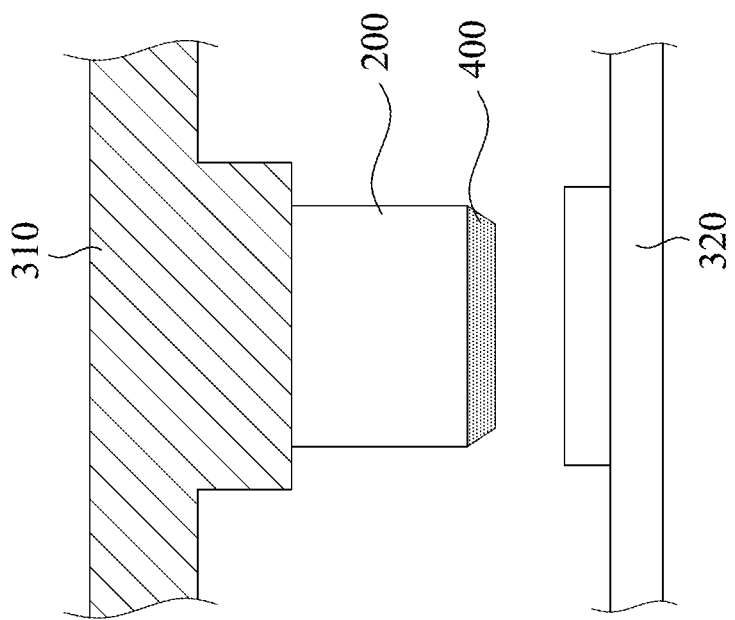
FIG. 5 is a schematic cross-sectional view of an intermediate stage of the method illustrated by FIG. 1 according to some other embodiments of the present disclosure.

Reference is made to FIG. 5. FIG. 5 is a schematic cross-sectional view of an intermediate stage of the method 100 illustrated by FIG. 1 according to some other embodiments of the present disclosure, in which the liquid layer 400 is formed on the micro device 200. In some embodiments, as shown in FIG. 5, before the transfer head 310 moves towards the substrate 320, the liquid layer 400 is formed on a side of the micro device 200 opposite to the transfer head 310, which is also the operation 120 of the method 100 in an alternative manner.

Please be noted that although only "a" micro device 200 is mentioned in the previous paragraphs, "a plurality of" micro devices 200 may be used in practical applications and is still within the scope of the present disclosure, and will not be emphasized in the present disclosure.

In summary, the embodiments of the present disclosure provide a method of handling a micro device in which both the first temperature of the transfer head and the second temperature of the substrate are respectively decreased and maintained to be lower than the environmental temperature. As such, when the transfer head is moved towards the substrate and the micro device is moved very close to the liquid layer, an evaporation of the liquid layer is slowed down at the moment the micro device is in contact with the liquid layer. In other words, the presence of the liquid layer is effectively maintained such that the two opposite sides of the liquid layer can be in contact with the micro device and the substrate respectively.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the method and the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of handling a micro device, comprising:
holding the micro device by a transfer head;
forming a liquid layer on a surface of the micro device opposite to the transfer head;
maintaining a first temperature of the transfer head to be lower than an environmental temperature;
maintaining a second temperature of a substrate to be lower than the environmental temperature; and
moving the transfer head towards the substrate to make the liquid layer be in contact with the substrate after forming the liquid layer.

2. The method of claim 1, wherein the environmental temperature is lower than 40 degree Celsius.

3. The method of claim 1, further comprising:
maintaining a relative humidity of an environment to be higher than 40%.

4. The method of claim 1, further comprising:
evaporating the liquid layer such that the micro device is bound to the substrate.

5. The method of claim 4, further comprising:
separating the transfer head from the micro device after the micro device is bound to the substrate.

6. The method of claim 1, wherein the liquid layer is condensed from water vapor.

7. The method of claim 1, wherein the micro device is microscopic light emitting diode (micro-LED).

8. The method of claim 1, wherein the first temperature is the same as the second temperature.

9. The method of claim 1, wherein the first temperature is different from the second temperature.

* * * * *